(12) United States Patent
Verbugt et al.

(10) Patent No.: US 11,012,655 B2
(45) Date of Patent: May 18, 2021

(54) IMAGE SENSOR INCLUDING READ-OUT CIRCUITRY AND IMAGING SYSTEM COMPRISING THE IMAGING SENSOR

(71) Applicant: Teledyne DALSA B.V., Thousand Oaks, CA (US)

(72) Inventors: Daniel Wilhelmus Elisabeth Verbugt, Helden (NL); Willem-Hendrik Maes, Lommel (BE)

(73) Assignee: TELEDYNE DALSA B.V., Thousand Oaks, CA (US)

( * ) Notice: Subject to any disclaimer, the term of this patent is extended or adjusted under 35 U.S.C. 154(b) by 78 days.

(21) Appl. No.: 16/357,102

(22) Filed: Mar. 18, 2019

(65) Prior Publication Data
US 2019/0289237 A1   Sep. 19, 2019

(30) Foreign Application Priority Data

Mar. 16, 2018  (EP) ..................................... 18162354

(51) Int. Cl.
*H04N 5/378* (2011.01)
*H01L 27/146* (2006.01)
*H04N 5/355* (2011.01)
*H04N 5/3745* (2011.01)

(52) U.S. Cl.
CPC ....... *H04N 5/378* (2013.01); *H01L 27/14609* (2013.01); *H01L 27/14643* (2013.01); *H04N 5/3559* (2013.01); *H04N 5/35509* (2013.01); *H04N 5/35527* (2013.01); *H04N 5/35581* (2013.01); *H04N 5/3745* (2013.01)

(58) Field of Classification Search
None
See application file for complete search history.

(56) References Cited

U.S. PATENT DOCUMENTS

| | | | | |
|---|---|---|---|---|
| 5,521,640 A * | 5/1996 | Prater | ................... | H04N 9/045 348/273 |
| 9,479,717 B2 * | 10/2016 | Hynecek | ................ | H01L 31/105 |
| 9,961,262 B2 * | 5/2018 | Okura | ................ | H01L 27/14609 |
| 2002/0106123 A1 * | 8/2002 | Inoue | ...................... | G06T 5/009 382/168 |
| 2004/0036785 A1 | 2/2004 | Takayanagi | | |
| 2004/0227109 A1 * | 11/2004 | Storm | .................... | H04N 5/361 250/551 |
| 2006/0126959 A1 * | 6/2006 | Padwick | .................. | G06T 5/50 382/254 |

(Continued)

OTHER PUBLICATIONS

European Search Report for EP18162354.7, dated Jul. 23, 2018.

*Primary Examiner* — Cynthia Segura
(74) *Attorney, Agent, or Firm* — Snell & Wilmer LLP

(57) ABSTRACT

The present invention relates to an image sensor and to an imaging system comprising such a sensor. According to the invention, the overall conversion curve describing the conversion between photon flux and digital number comprises a first region in which the conversion is essentially linear and a second region in which the conversion is essentially non-linear.

According to the invention, the non-linearity of the second region is obtained by operating the photodiode of the image sensor in its non-linear range and by changing the gain associated with the conversion between pixel voltage and digital number.

15 Claims, 5 Drawing Sheets

(56) References Cited

U.S. PATENT DOCUMENTS

| | | | | |
|---|---|---|---|---|
| 2007/0071353 | A1* | 3/2007 | Kitamura | G06T 5/20 |
| | | | | 382/264 |
| 2007/0097240 | A1* | 5/2007 | Egawa | H04N 5/335 |
| | | | | 348/308 |
| 2007/0126921 | A1* | 6/2007 | Gallagher | H04N 5/2355 |
| | | | | 348/362 |
| 2009/0256156 | A1* | 10/2009 | Hsieh | H01L 27/14641 |
| | | | | 257/72 |
| 2011/0026051 | A1* | 2/2011 | Wang | G06T 7/13 |
| | | | | 358/1.9 |
| 2015/0319383 | A1* | 11/2015 | Maes | H04N 5/378 |
| | | | | 348/308 |
| 2018/0013970 | A1* | 1/2018 | Fossum | H04N 5/35509 |
| 2019/0379848 | A1* | 12/2019 | Berkovich | H04N 5/3692 |
| 2020/0162691 | A1* | 5/2020 | Mori | H04N 5/378 |

* cited by examiner

IMAGE SENSOR INCLUDING READ-OUT CIRCUITRY AND IMAGING SYSTEM COMPRISING THE IMAGING SENSOR

CROSS-REFERENCE TO RELATED APPLICATIONS

The present application is a U.S. national phase entry of and claims priority from European Application No. EP 18162354.7, filed on Mar. 16, 2018, which is hereby fully incorporated herein by reference in its entirety.

The present invention relates to an image sensor and to an imaging system comprising such a sensor.

In known CMOS based image sensors, each pixel comprises a photodiode and a storage capacitor that is electrically connected to the photodiode. The photodiode is configured to generate a photocurrent as a result of photons that fall onto the pixel during an integration time, and to generate a photo voltage by charging the storage capacitor using the generated photo current. The photodiode is operable in a first mode, wherein a capacitance of the photodiode is negligible relative to the capacitance of the storage capacitor and/or substantially constant with respect to the photo voltage, and a second mode, wherein a capacitance of the photodiode is non-negligible relative to the capacitance of the storage capacitor and varies as function of the photo voltage.

The known image sensor comprises read-out circuitry for reading out the photo voltage of each pixel, for determining a pixel voltage based on the read photo voltage, and for converting the pixel voltage for each pixel into a respective digital number (DN) that is representative for a flux of photons received by that pixel during the integration time.

Prior to collecting the incoming photons, the voltage over the storage capacitor, i.e. the photo voltage, is reset to a predefined voltage, e.g. 3V. During the subsequent detection process, the photodiode will generate a photocurrent that is fed to the storage capacitor. As a result, the photo voltage will decrease.

A reliable determination of the pixel voltage can only be ensured when the photo voltage is not too low. If the photo voltage has reached a given lower limit, the pixel voltage will no longer reflect the flux of incoming photons. In such circumstances, the pixel is said to be saturated.

In the known image sensor, a non-correlated sampling scheme is used. In this case, the read-out circuitry is configured to perform a first readout comprising resetting the photo voltage to a predefined voltage, accumulating charge in the storage capacitor during the integration time, and reading out the photo voltage as a first voltage a predefined time after having reset the photo voltage. In a second readout, the photo voltage is reset to the predefined voltage and the photo voltage is read out as a second voltage substantially directly after having reset the photo voltage. The read-out circuitry then computes the pixel voltage by subtracting the second voltage from the first voltage.

In the known image sensor, the conversion between the pixel voltage and the digital number is substantially linear. The conversion between pixel voltage and digital number can be described by a conversion curve that has a derivative that corresponds to a gain value. This conversion curve applies to photo voltages that are associated with incoming photon fluxes that are below a first flux threshold (th1). In the known image sensor, th1 corresponds to the saturation flux and the photodiode operates substantially only in the first mode.

The readout circuitry may for example comprise an analog-to-digital converter (ADC) that transforms the pixel voltage into a digital number based on the gain value. Here, the gain value can be described as the inverse of the change in pixel voltage that is required for changing the digital number by one bit.

FIGS. 1A-1D illustrate the typical behavior of a known image sensor. Here, the photo voltage (Vphoto) decreases linearly as a function of the flux of incoming photons. The maximum voltage equals a predefined voltage (Vreset), e.g. 3V. The minimum voltage (Vmin) may equal 1V and corresponds to the minimum photo voltage that can be read reliably. As can be observed from FIG. 1A, the photo voltage will drop below Vmin at high fluxes. In this region, the capacitance of the photodiode becomes non-linear. However, in the known image sensor, the relationship between the photo voltage and the photon flux is linear in the region between the Vreset and Vmin.

FIG. 1B illustrates the relationship between the pixel voltage and the photo voltage based on the abovementioned non-correlated sampling scheme.

FIG. 1C illustrates the conversion between the pixel voltage and a digital number. For this conversion, analog-to-digital converters (ADCs) are generally used. To utilize the full resolution of the ADC, the maximum digital number (DN) should correspond to the maximum pixel voltage and the lowest digital number should correspond to the lowest pixel voltage.

FIG. 1C also illustrates the gain for the conversion from pixel voltage to digital number. This gain can be computed as 1 divided by the difference in pixel voltage that is associated with a change in digital number of 1 bit.

FIG. 1D is obtained by combining FIGS. 1A-1C, and neglecting dark currents. As illustrated, the known image sensor displays a linear relationship between flux and digital number. To image a particular region of interest, the exposure settings are adjusted such that the linear region is optimally used. This will display the largest amount of details in that part of the image that corresponds to the region of interest. However, using such exposure settings may cause the regions outside of the region of interest to be imaged incorrectly. For example, the part of the image corresponding to these regions may display saturation.

For some applications, the region of interest should be imaged accurately while at the same time some contrast should be left for other regions outside of this region of interest. This particularly holds if the other regions correspond to substantially higher light intensities than the region of interest. An example of such a scenario could be if an object to be imaged is situated close to a high intensity light source. In those cases, it is desirable if the object is imaged with relatively high resolution, whereas contours should be visible for the light source. It has been found that this demand cannot be met using the known image sensor.

It is an object of the present invention to provide a solution to the abovementioned problem. This object has been achieved with the image sensor as defined in claim 1, which is characterized in that the read-out circuitry is further configured such that the conversion curve comprises a first knee point that marks a transition between the first voltage range and a second voltage range. The second voltage range is associated with incoming photon fluxes that are equal to or above the first flux threshold. According to the invention, a derivative of the conversion curve with respect to pixel voltages in the second voltage range corresponds to a second gain value that is lower than the first gain value.

In addition to the above, the invention is further characterized in that the photodiode is configured to switch, during the integration time, from operating in the first mode to operating in the second mode, when the photo voltage has reached a value that is associated with the incoming photon flux having exceeded a second flux threshold (th2).

Compared to the abovementioned known image sensor, the image sensor of the present invention introduces two sources of non-linearity in the overall conversion curve between incoming photon flux and digital number. A first knee point is introduced when the gain value switches in dependence of the pixel voltage. This knee point is related to the conversion between photo voltage and digital number, via the pixel voltage. A second knee point is introduced when the photodiode starts to operate in the second mode. This second knee point is related to the conversion between incoming photon flux and photo voltage.

The non-linearity in the overall conversion curve starts for incoming photon fluxes that are above the first or second flux threshold, whichever is lower. Prior to this lowest threshold, the overall conversion curve is linear as the photodiode is operating in the first mode and the read-out circuitry is operating using a constant first gain value. By appropriately choosing the first and second flux thresholds it becomes possible to use the linear part of the overall conversion curve for converting photo voltages of pixels that are associated with a region of interest, and wherein the photo voltage of pixels that fall outside of such region and which receive a relatively higher amount of photons are converted using the non-linear part. The linear part allows for a high sensitivity of the image sensor, whereas the non-linear part enables a high dynamic range for regions for which the subtle details are less relevant and for which a high amount of incoming photons is to be expected.

The second flux threshold is preferably larger than the first flux threshold. Changing the gain of the read-out circuitry can be achieved within a relatively short pixel voltage range whereas the transition between the first and second operating modes of the photodiode occurs over a larger photo voltage range. By setting the second flux threshold to be larger than the first flux threshold a smooth transition between the linear and non-linear parts of the overall conversion curve can be achieved while ensuring a highly linear conversion for incoming photon fluxes that are below the first threshold.

Preferably, the second flux threshold lies in between the first flux threshold and a saturation threshold (sat) that corresponds to a flux at which a pixel saturates. More in particular, the second flux threshold may be computed using $th2=th1+(sat-th1) \times a$, wherein a lies within the range from 0.0 to 0.4, more preferably 0.1 to 0.3, and more preferably 0.15 to 0.25.

The photodiode may comprise a junction between a first semiconductor region of a first charge type and a second semiconductor region of a second charge type different from the first charge type, wherein the second region is connected to a fixed and stable voltage, such as ground, and wherein the first region is connected to a photodiode contact, wherein, in the first mode of operation, substantially no free majority charge carriers are available in the first region, and wherein, in the second mode of operation, free majority charge carriers are available. In the first mode of operation, the capacitance of the photodiode is determined by the depletion regions on either side of the junction. Due to the absence of free charges at these working voltages, the capacitance associated with the junction is relatively low. On the other hand, in the second mode of operation, the charges are arranged relatively close to each other, resulting in a relatively high capacitance. By limiting the thickness and the doping level of the first semiconductor region, it can be achieved that the depletion region remains deprived of free majority charge carriers over a large voltage range. Because the first region in this case is fully depleted, the resulting capacitance will be substantially voltage independent. Furthermore, by appropriately choosing the capacitance of the storage capacitor relative to the capacitance of the photodiode it can be achieved that, in the first mode of operation, the overall capacitance, which equals the sum of the photodiode capacitance and the external storage capacitance, is dominated by the external storage capacitance, whereas in the second mode of operation, the overall capacitance strongly depends on or is dominated by the capacitance of the photo diode, which is then voltage dependent.

The image sensor may further comprise a third semiconductor region of the second charge type, wherein the second region is arranged in between the first region and the third region, wherein a doping level of the second region is substantially larger than that of the third region. Mostly, the third region is considerably thicker than the second region. As such, a relatively larger portion of longer-wavelength photons will be absorbed in this layer. This process most often occurs in the third region due its relatively high thickness. By having a highly doped second region in between the first region and the third region, a built-in voltage is generated that drives electrons, which are generated by longer-wavelength photons and which would be diffusing from the third region towards the first region, away from the second region. Consequently, the decrease in spatial resolution caused by longer-wavelength photons will be reduced.

The image sensor may further comprise a fourth semiconductor region being of the second charge type and arranged on top of the first region, and a fifth region being of the first charge type, wherein the fifth region contacts the photodiode contact on one end and extends through the fourth region towards the first region on another end.

The fourth semiconductor region intends to significantly reduce the impact of the deep traps that are active near the semiconductor surface. These traps may cause a relatively high dark current. By highly doping the top region of the semiconductor, these traps may be neutralized.

The image sensor may comprise a semiconductor substrate, which is typically grounded and which may have an epitaxial layer of the second charge type, wherein the pixels are formed in the epitaxial layer. Moreover, the third region may be formed by the epitaxial layer, and the second region may have been formed by means of a well implantation of the second charge type in the third region, the second region corresponding to a second well of the second charge type. In addition, the first region may have been formed by means of a well implantation of the first charge type in the second well and the fourth region may have been formed by means of a third implantation of the second charge type in and near the surface of the epitaxial layer, the fourth region corresponding to a surface region of the epitaxial layer. Finally, the fifth region may have been formed by means of a fourth implantation of the first charge type extending from the surface of the substrate through the surface region to the first region.

Although not limited thereto, the invention particularly relates to embodiments wherein the first charge type corresponds to n-type and wherein the second charge type corresponds to p-type. As an example, a doping level of the first layer may lie within a range from 1e16 to 5e16 per cubic centimeter, a doping level of the second layer may lie within a range from 1e17 to 5e17 per cubic centimeter, a doping level of the third layer may lie within a range from 1e18 to 5e18 per cubic centimeter, and a doping level of the fourth layer may lie within a range from 1e20 to 3e20 per cubic centimeter.

Each pixel may further comprise a reset switch for setting the photo voltage to a predefined voltage in dependence of a reset signal. Furthermore, each pixel may further comprise a select switch for selecting a pixel among the plurality of pixels for readout in dependence of a select signal, and a follower for feeding the photo voltage to the read-out circuity if the pixel has been selected for readout. This topology is generally known as a 3T layout as it can be implemented using three transistors. For example, the reset switch, the follower, and/or the select switch may be formed using a metal-oxide-semiconductor field effect transistor (MOSFET), preferably of the first charge type. Furthermore, the image sensor can be realized using Silicon based CMOS technology.

The read-out circuitry can be configured to perform a first readout comprising resetting the photo voltage to a predefined voltage, accumulating charge in the storage capacitor during the integration time, and reading out the photo voltage as a first voltage a predefined time after having reset the photo voltage. The read-out circuitry can be configured to perform a second readout comprising resetting the photo voltage to the predefined voltage and reading out the photo voltage as a second voltage substantially directly after having reset the photo voltage. Based on the first and second voltages, a pixel voltage may be computed. More in particular, the pixel voltage may be computed as the second voltage minus the first voltage. The readout-circuitry is configured for converting this pixel voltage into a digital number.

The readout-circuitry may be configured to, for pixel voltages below a third threshold, compute the digital number based on the pixel voltage and the first gain value, and, for pixel voltages above the third threshold, compute the digital number based on the pixel voltage, the pixel voltage at or close to the third threshold, and the second gain value. The third threshold of the pixel voltage may correspond to the first knee point in the conversion curve.

The storage capacitor is preferably arranged outside of the photodiode. For example, the storage capacitor can be a metal-oxide-semiconductor capacitor having a first conductive terminal connected to the photodiode contact and a second terminal that is grounded. Alternatively, the storage capacitor may correspond to the capacitance of the photodiode. As stated before, by appropriately choosing the layer stack of the photodiode, the capacitance of the photodiode may exhibit the desired linear and non-linear behavior.

According to a second aspect, the present invention provides an imaging system that comprises a light source, the image sensor as described above, and an image processing unit for receiving, for each pixel, a digital number corresponding to the pixel voltage and for constructing an image based on the received digital numbers. The image processing unit may be configured to adjust the digital numbers prior to generating an image, based on the non-linear response of the pixel voltage of each pixel as a function of the flux of incident photons.

Next, the present invention will be described in more detail by referring to the appended drawings, wherein.

Figure 1A:
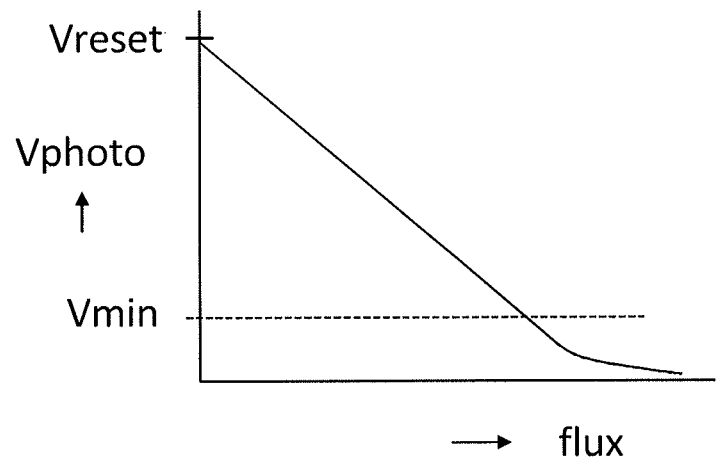
FIGS. 1A-1D illustrate the relationship between the flux of photons, the photo voltage, the pixel voltage, and the digital numbers for a known image sensor.
Figure 1B:
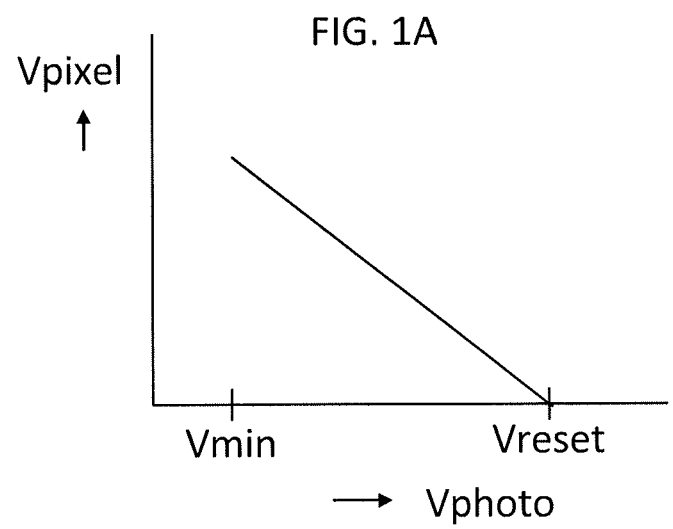
Figure 1C:
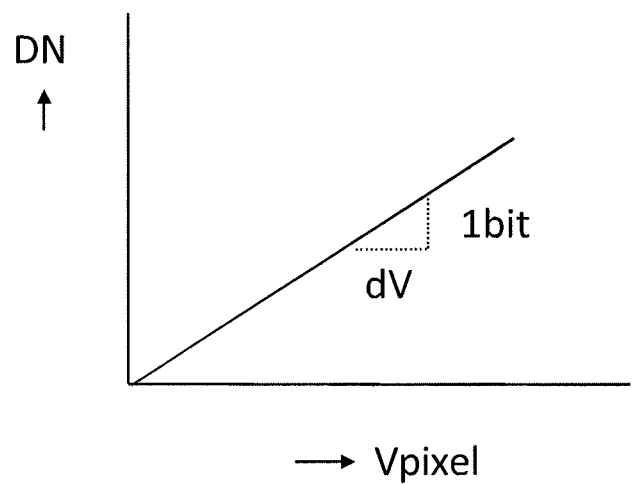
Figure 1D:
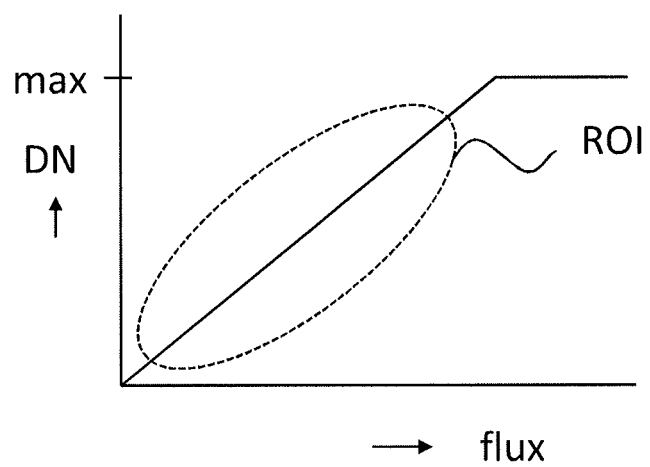
Figure 2:
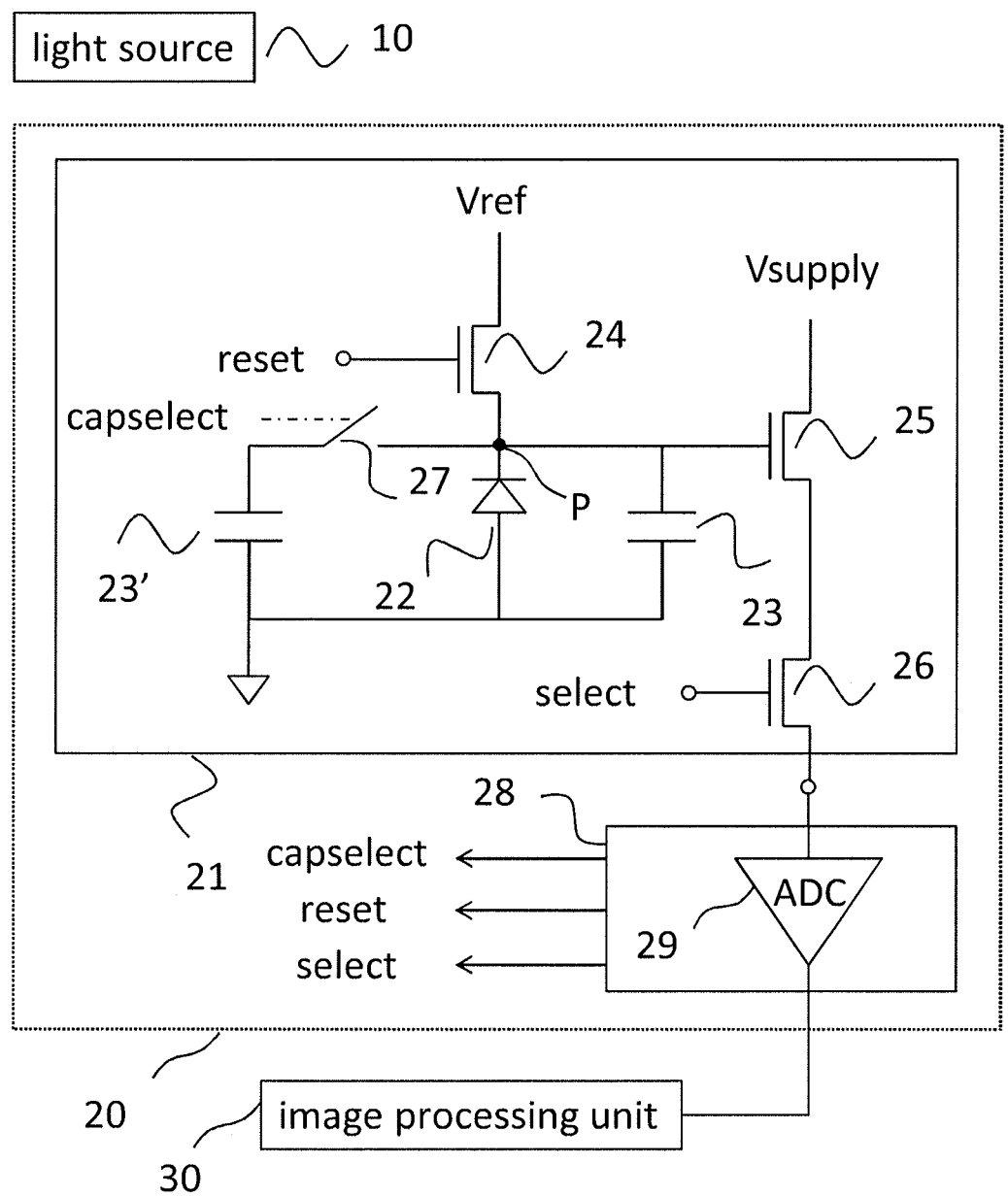
FIG. 2 illustrates an imaging system in accordance with the present invention.

FIG. 2 illustrates an embodiment of an imaging system in accordance with the present invention. This system comprises a light source 10 that emits photons corresponding to a particular wavelength, such as photons corresponding to visible light, towards an image sensor 20. The imaging system further comprises an image processing unit 30 for constructing an image based on the output received from image sensor 20.

Image sensor 20 comprises a plurality of pixels 21. Each pixel 21 comprises a photodiode 22 and one or more storage capacitors 23, 23'. Pixel 21 comprises a switch 27 for either connecting capacitor 23' in parallel to capacitor 23 or to disconnect capacitor 23' from capacitor 23.

Pixel 21 in FIG. 2 is a dual full-well pixel. The total capacitance available for storing charges is equal to the sum of the capacitance of capacitor 23 and the capacitance of photodiode 22 or to the sum of the capacitances of capacitors 23, 23' and the capacitance of photodiode 22, depending on the setting of switch 27. This allows the storage capacitance of pixel 21 to be adjusted depending on the exposure settings.

Connection point P is electrically connected to the photodiode contact, to a terminal of storage capacitor 23, to a terminal of storage capacitor 23', albeit via switch 27, to a reset transistor 24, and to a source follower 25. Here, reset transistor 24 and source follower 25 are formed as a metal-oxide-semiconductor field-effect transistor (MOSFET). Reset transistor 24 is arranged to set the voltage at connection point P, referred to as the photo voltage, equal to a reference voltage (Vref) in dependence of a reset signal 'reset'. Source follower 25 is configured to feed the photo voltage, via a select transistor 26, to readout-circuitry 28. Here, it is noted that source follower 25 is only capable of feeding through the photo voltage if this voltage is above a given minimum level Vmin and if select transistor 26 is brought into a conductive state in dependence of a select signal 'select'.

Image sensor 20 further comprises read-out circuitry 28. In readout-circuitry 28, an analog-to-digital converter 29 is arranged which transforms the pixel voltage into a digital number. This number is fed to an image processing unit 30 that uses the digital number(s) for generating an image.

Readout-circuitry 28 controls the readout of each of the plurality of pixels 21. These pixels are normally arranged in an active matrix, wherein a row of pixels is simultaneously selected for readout. For example, read-out circuitry 28 may output a select signal to each pixel in a given row. To that end, readout-circuitry 28 may comprise a shift register known in the art. It is noted that active matrices are well known in the art. An elaborate discussion is therefore deemed unnecessary.

Next, the operation of pixel 21 will be described in detail. As a first step, readout-circuitry 28 generates a reset signal by which the pixels in a given row, or every pixel in the matrix, is reset. Consequently, the photo voltage for each pixel 21 is set to the reference voltage Vref. This is achieved by charging storage capacitor(s) 23, 23' via reset switch 24. Next, photons are collected during a given amount of time, the so-called integration time, using photodiode 22. This diode will generate a photocurrent that will gradually discharge storage capacitor(s) 23, 23' and will lower the photo voltage. After expiry of the integration time, readout-circuitry 28 will output a select signal to select the pixels in the given row. As a result, select transistors 26 will be brought into the conductive state allowing the photo voltage to be fed to read-out circuitry 28 using source follower 25. Within read-out circuitry 28, it will be stored as a first voltage.

Next, a second readout will be performed. As before, first a reset signal will be provided to the pixels in the row to set the photo voltage equal to approximately Vref. Directly after resetting the photo voltage, a select signal will be provided allowing the photo voltage, which is equal to approximately Vref, to be fed to readout-circuitry 28. There, it will be stored as a second voltage.

Readout-circuitry 28 will compute a pixel voltage by subtracting the second voltage from the first voltage. This pixel voltage will be converted into a digital number by ADC 29. Read-out circuitry 28 will provide the digital numbers for each pixel in the row to image processing unit 30. Once information is received for each row in the matrix of pixels, an image can be generated.

The operation described above is but one possible mode of operation. The invention does not exclude other modes of operation.

The digital number that is output by read-out circuitry 28 is determined by the conversion from photon flux to photo voltage and by the conversion from photo voltage, via the pixel voltage, into a digital number. This will be explained in more detail below.

Figure 3:
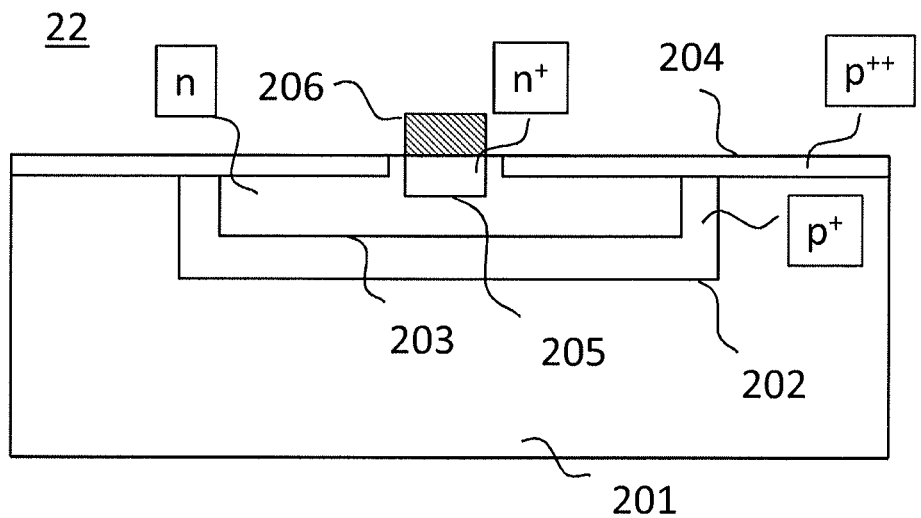
FIG. 3 illustrates a cross section of a photodiode in accordance with the present invention.

A cross section of photodiode 22 is shown in FIG. 3. Photodiode 22 comprises a substrate having an epitaxial layer. Here, the epitaxial layer is p-type and forms a third region 201. To form photodiode 22, a $p^+$-implantation is performed to realize a second region 202 that is in the form of a $p^+$-well. A subsequent n-implantation is performed to realize a first region 203 that is in the form of an n-well. Next, a $p^{++}$-implantation is performed for stabilizing the surface of the substrate. This implantation will form fourth regions 204 of the $p^{++}$ type. A window is created in this layer through which an $n^+$-implantation is performed. This implantation will generate a fifth region 205 of the $n^+$-type. A photodiode contact, comprising a conductive terminal 206, is arranged on top of fifth region 205 to provide a low ohmic contact to first region 203. The underlying substrate is connected to ground.

The capacitance of photodiode 22 is determined by the distribution of charges in photodiode 22. In the known image sensors, photodiode 22 is designed such that in the photo voltage range between the minimum voltage Vmin that can be fed to read-out circuitry 28 and Vref, the capacitance of photodiode 22 is substantially linear. By using linear storage capacitors 23, 23', a linear conversion between the photon flux and the photo voltage is therefore obtained.

According to the invention, photodiode 22 is designed such that within the abovementioned voltage range, photodiode 22 changes its operational mode from working in a first mode, wherein the photodiode capacitance is constant with respect to the photo voltage and/or wherein the photodiode capacitance is negligible compared to the total external storage capacitance, into working in a second mode in which the relationship between the photon flux and photo voltage is non-linear and wherein the capacitance of the photodiode is non-negligible relative to the total storage capacitance. The photo voltage at which the transition occurs from the first mode of operation to the second mode of operation is related to a photon flux that equals a second threshold value th2.

The conversion from pixel voltage to digital number is obtained using ADC 29. In the known readout-circuitry, ADC 29 is designed such that each increment in the digital number relates to a substantially identical difference in pixel voltage. Consequently, the derivative of the conversion curve describing the conversion between pixel voltage and digital number is substantially constant and equal to a first gain value.

According to the invention, read-out circuitry 28 is designed such that the derivative of the conversion curve, which describes the conversion between pixel voltage and digital number, changes from a first gain value in a first range of the pixel voltage to a second gain value for pixel voltages in a second range. Here, the first range of pixel voltages relates to photon fluxes that are below a first threshold th1. For photon fluxes above th1, the derivative of the conversion curve equals the second gain value.

According to the invention, the combined effect of both conversion processes described above is indicated in FIG. 4. In a first part, for fluxes between 0 and th1, the conversion between photon flux and digital number is essentially linear. In a second part, for fluxes between th1 and th2, the gain value for the ADC has changed to the second gain value but the photodiode is still operating in the first mode. In a third part for fluxes larger than th2, the photodiode is operating in the second mode and the gain value still equals the second gain value. As the second gain value is smaller than the first gain value, an increment in digital number in the second and third parts of the curve corresponds to a substantially larger difference in photon flux. It should be noted that this larger difference in photon flux is not necessarily related to a large difference in photo voltage because the capacitance of photodiode 22 is substantially larger when photodiode 22 operates in the second region.

Figure 4:
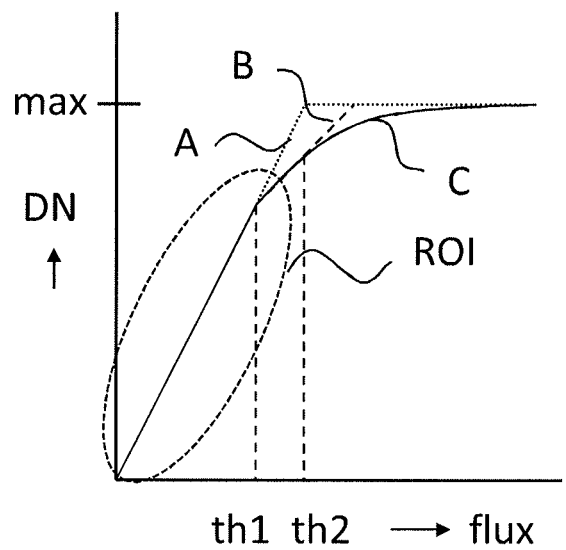
FIG. 4 illustrates a relationship between the digital number and the flux of photons in accordance with the present invention.

FIG. 4 illustrates a region ROI that corresponds to a flux range that is of particular interest for imaging an object or scene. To appropriately image the object or scene, it is desired to convert this flux range into a relatively large digital number (DN) range. In known image sensors, this is obtained using curve A, which represents a fully linear conversion between photon flux and DN.

As FIG. 4 illustrates, when using the known conversion described by curve A, the pixels will not be able to detect high fluxes without reaching saturation. Consequently, due to the fact that a high range in DN is desired to cover a given range in photon flux, the known image sensor is not capable to output useful information regarding high fluxes.

The invention solves this problem by adapting the conversion curve. A first contribution to this curve is the change in the gain of the read-out circuitry as indicated by curve B. As can be seen in FIG. 4, the maximum DN now corresponds to a higher photon flux.

A second contribution to the adaptation of the conversion curve is the change in operational mode of photodiode 22 from the first mode to the second mode. The combination of this latter effect with that of curve B is indicated as curve C, which clearly indicates that a much higher photon flux can be detected.

Figure 5:
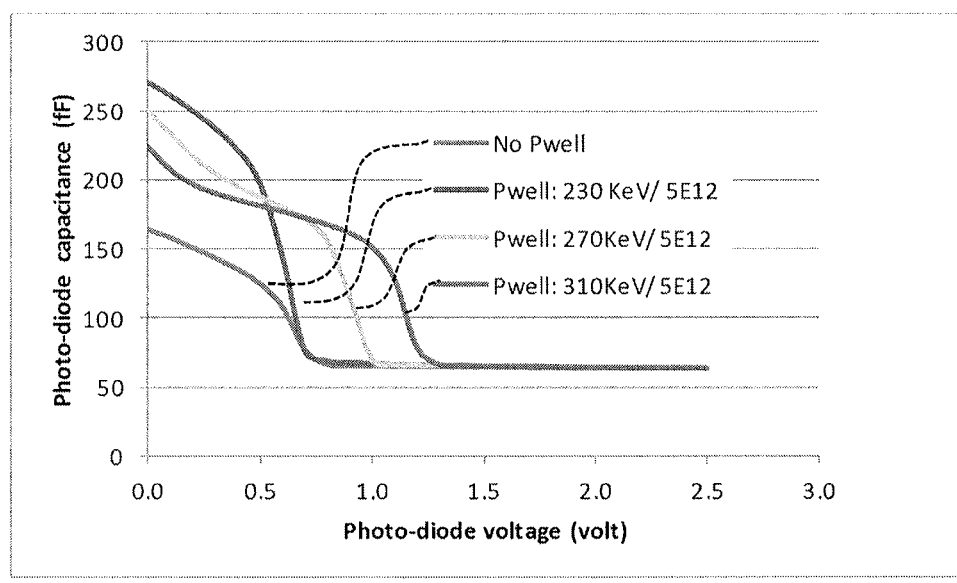
FIG. 5 illustrates the capacitance of the photodiode according to the invention for various doping levels of the second region.

The photo voltage at which the transition from the first mode to the second mode occurs, depends on the doping levels of second region 202 and region 203. Assuming that the doping level 203 is fixed, when the doping level of region 202 is increased, the photo voltage at which the non-linear behavior starts, will occur at a higher photo voltage. This is illustrated in FIG. 5.

By appropriately selecting the doping level of the second region, the desired curve C in FIG. 4 can be obtained. Although the curve in FIG. 4 illustrates that th1<th2, the present invention does not exclude embodiments wherein th2<th1. However, preferably, the image sensor of the present invention is configured such that th2=0.2×(sat−th1)+th1, wherein sat is equal to the flux at which the pixel saturates.

Furthermore, the pixel voltage may be computed in dependence of the photo voltage different from the non-correlated sampling scheme described above.

In the description above, the invention has been described using various embodiments thereof. It should be apparent to the skilled person that the invention is not limited to these embodiments but that various modifications can be made without departing from the scope of protection that is defined by the appended claims.

The invention claimed is:

1. An image sensor, comprising:
   a plurality of photosensitive pixels, each pixel including a photodiode and a storage capacitor electrically connected to the photodiode, wherein the photodiode is configured to generate a photocurrent as a result of photons that fall onto the pixel during an integration time, and to generate a photo voltage by charging the storage capacitor using the generated photo current, and wherein the photodiode is operable in a first mode, wherein a capacitance of the photodiode is negligible relative to the capacitance of the storage capacitor or constant with respect to the photo voltage, and a second mode, wherein a capacitance of the photodiode is non-negligible relative to the capacitance of the storage capacitor and/or varies as a function of the photo voltage;
   read-out circuitry for reading out the photo voltage of each pixel, for determining a pixel voltage based on the read photo voltage, and for converting the pixel voltage for each pixel into a respective digital number that is representative for a flux of photons received by that pixel during the integration time, said read-out circuitry being configured such that, with respect to pixel voltages in a first voltage range, a conversion curve describing the conversion between the pixel voltage and the digital number has a derivative that corresponds to a first gain value, said first voltage range being associated with incoming photon fluxes that are below a first flux threshold;
   the read-out circuitry is further configured such that the conversion curve includes a first knee point that marks a transition between the first voltage range and a second voltage range, said second voltage range being associated with incoming photon fluxes that are equal to or above the first flux threshold, wherein a derivative of the conversion curve with respect to pixel voltages in the second voltage range corresponds to a second gain value that is lower than the first gain value; and
   wherein the photodiode is configured to switch, during the integration time, from operating in the first mode to operating in the second mode, when the photo voltage has reached a value that is associated with the incoming photon flux having exceeded a second flux threshold.

2. The image sensor of claim 1, wherein the second flux threshold is larger than the first flux threshold.

3. The image sensor of claim 1, wherein the second flux threshold is either in between the first flux threshold and a saturation threshold that corresponds to a flux at which a pixel saturates or equal to the first flux threshold.

4. The image sensor of claim 3, wherein the second flux threshold (th2) can be computed from the first flux threshold (th1) and the saturation threshold (sat) using the equation th2=th1+(sat−th1)×a, wherein a lies with the range from 0.0 to 0.4.

5. The image sensor of claim 1, wherein the photodiode comprises a junction between a first semiconductor region of a first charge type and a second semiconductor region of a second charge type different from the first charge type, wherein the second semiconductor region is connected to a fixed and stable voltage, such as ground, and wherein the first semiconductor region is connected to a photodiode contact, wherein, in the first mode of operation, no free majority charge carriers are available in the first semiconductor region, and wherein, in the second mode of operation, free majority charge carriers are available.

6. The image sensor of claim 5, further comprising a third semiconductor region of the second charge type, wherein the second semiconductor region is arranged in between the first semiconductor region and the third semiconductor region, wherein a doping level of the second semiconductor region is larger than that of the third semiconductor region.

7. The image sensor of claim 6, further comprising a fourth semiconductor region being of the second charge type and arranged on top of the first semiconductor region, and a fifth semiconductor region being of the first charge type, wherein the fifth semiconductor region contacts the photodiode contact on one end and extends through the fourth semiconductor region towards the first semiconductor region on another end.

8. The image sensor of claim 7, further comprising a semiconductor substrate having an epitaxial layer of the second charge type, wherein the pixels are formed in the epitaxial layer, and wherein:
   the third semiconductor region is formed by the epitaxial layer;
   the second semiconductor region has been formed by means of a well implantation of the second charge type in the third semiconductor region, the second semiconductor region corresponding to a second well of the second charge type;
   the first semiconductor region has been formed by means of a well implantation of the first charge type in the second well;
   the fourth semiconductor region has been formed by means of a third implantation of the second charge type in and near the surface of the epitaxial layer, the fourth semiconductor region corresponding to a surface region of the epitaxial layer; and
   the fifth semiconductor region has been formed by means of a fourth implantation of the first charge type extending from the surface of the substrate through the surface region to the first semiconductor region.

9. The image sensor of claim 5, wherein the first charge type corresponds to n-type and wherein the second charge type corresponds to p-type;
   wherein a doping level of the first layer lies within a range from 1e16 to 5e16 per cubic centimeter;
   wherein a doping level of the second layer lies within a range from 1e17 to 5e17 per cubic centimeter;
   wherein a doping level of the third layer lies within a range from 1e18 to 5e18 per cubic centimeter; and
   wherein a doping level of the fourth layer lies within a range from 1e20 to 3e20 per cubic centimeter.

10. The image sensor of claim 1, wherein each pixel further includes a reset switch for setting the photo voltage to a predefined reset voltage in dependence of a reset signal;

wherein each pixel further includes a select switch for selecting a pixel among the plurality of pixels for readout in dependence of a select signal, and a follower for feeding the photo voltage to the read-out circuitry if the pixel has been selected for readout; and wherein the reset switch, the follower, and the select switch is formed using a metal-oxide-semiconductor field effect transistor (MOSFET), of the first charge type.

11. The image sensor of claim 1, wherein the read-out circuitry is configured to perform:

a first readout including resetting the photo voltage to a predefined voltage, accumulating charge in the storage capacitor during the integration time, and reading out the photo voltage as a first voltage a predefined time after having reset the photo voltage; and a second readout including resetting the photo voltage to the predefined voltage and reading out the photo voltage as a second voltage after having reset the photo voltage;

wherein a pixel voltage is computed as the second voltage minus the first voltage.

12. The image sensor of claim 11, wherein the readout-circuitry is configured to:

for pixel voltages below a third threshold, compute the digital number based on the pixel voltage and the first gain value;

for pixel voltages above the third threshold, compute the digital number based on the pixel voltage, the pixel voltage at or close to the third threshold, and the first and second gain value;

wherein the third threshold of the pixel voltage corresponds to the first knee point in the conversion curve.

13. The image sensor of claim 1, wherein the storage capacitor is arranged outside of the photodiode;

wherein the storage capacitor is a metal-oxide-semiconductor capacitor having a first conductive terminal connected to the photodiode contact and a second terminal that is grounded.

14. The image sensor of claim 1, wherein the storage capacitor corresponds to the capacitance of the photodiode.

15. An imaging system, comprising:

a light source;

an image sensor;

an image processing unit for receiving, for each pixel, a digital number corresponding to the pixel voltage and for constructing an image based on the received digital numbers;

wherein the image processing unit is configured to adjust the digital numbers prior to generating an image, based on the non-linear response of the pixel voltage of each pixel as a function of the flux of incident photons.

* * * * *